United States Patent
Shin et al.

(10) Patent No.: US 9,911,939 B2
(45) Date of Patent: Mar. 6, 2018

(54) ORGANIC LIGHT EMITTING DISPLAY DEVICE HAVING 2 STACK STRUCTURE AND A METAL OXIDE

(71) Applicant: LG Display Co., Ltd., Seoul (KR)

(72) Inventors: Jeongkyun Shin, Paju-si (KR); Hyukchan Gee, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/460,815

(22) Filed: Mar. 16, 2017

(65) Prior Publication Data

US 2017/0186987 A1 Jun. 29, 2017

Related U.S. Application Data

(62) Division of application No. 14/847,867, filed on Sep. 8, 2015, now Pat. No. 9,634,293.

(30) Foreign Application Priority Data

Sep. 30, 2014 (KR) .......................... 10-2014-0132090

(51) Int. Cl.
*H01L 51/50* (2006.01)
*H01L 51/56* (2006.01)
(Continued)

(52) U.S. Cl.
CPC ........ *H01L 51/504* (2013.01); *H01L 27/3211* (2013.01); *H01L 51/5004* (2013.01);
(Continued)

(58) Field of Classification Search
CPC ............... H01L 51/504; H01L 51/5056; H01L 51/5064; H01L 51/5068; H01L 51/5072; H01L 51/508; H01L 51/5084
See application file for complete search history.

(56) References Cited

U.S. PATENT DOCUMENTS

2005/0242712 A1 11/2005 Sung
2013/0146850 A1 6/2013 Pieh et al.
(Continued)

FOREIGN PATENT DOCUMENTS

CN 103513312 A 1/2014
JP 2008-91381 A 4/2008
(Continued)

*Primary Examiner* — Hoai V Pham
(74) *Attorney, Agent, or Firm* — Birch, Stewart, Kolasch & Birch, LLP

(57) ABSTRACT

An organic light emitting display (OLED) device can include a substrate on which first to third light emitting portions are defined, first electrodes respectively positioned on the first to third light emitting portions, a first stack formed on the first electrodes and including first, second and third light emitting layers corresponding to the first, second and third light emitting portions, respectively, an N-type charge generation layer (CGL) positioned on the first stack, a transition metal oxide layer positioned on the N-type CGL, a second stack positioned on the transition metal oxide layer and including fourth, fifth and sixth light emitting layers corresponding to the first, second and third light emitting portions, respectively, and a second electrode positioned on the second stack.

14 Claims, 7 Drawing Sheets

(51) Int. Cl.
*H01L 51/52* (2006.01)
*H01L 27/32* (2006.01)

(52) U.S. Cl.
CPC ...... *H01L 51/5203* (2013.01); *H01L 51/5278* (2013.01); *H01L 51/56* (2013.01); *H01L 51/5056* (2013.01); *H01L 51/5072* (2013.01); *H01L 51/5088* (2013.01); *H01L 51/5096* (2013.01); *H01L 2251/303* (2013.01)

(56) References Cited

U.S. PATENT DOCUMENTS

2014/0225102 A1* 8/2014 Ikeda ..................... H01L 33/26
257/43
2016/0043338 A1 2/2016 Seo et al.

FOREIGN PATENT DOCUMENTS

| KR | 10-2012-0047003 A | 5/2012 |
| KR | 10-2013-0097647 A | 9/2013 |
| KR | 10-2014-0034686 A | 3/2014 |
| KR | 10-2014-0055911 A | 5/2014 |

* cited by examiner

ORGANIC LIGHT EMITTING DISPLAY DEVICE HAVING 2 STACK STRUCTURE AND A METAL OXIDE

CROSS-REFERENCE TO RELATED APPLICATIONS

This application is a Divisional of U.S. application Ser. No. 14/847,867 filed on Sep. 8, 2015, which claims the priority benefit of Korean Patent Application No. 10-2014-0132090 filed on Sep. 30, 2014, in the Republic of Korea, all of which are hereby expressly incorporated herein by reference into the present application.

BACKGROUND

Field of the Invention

This document relates to an organic light emitting display device and, more particularly, to a hybrid organic light emitting display device having a stack structure allowing for a soluble process and a deposition process.

Description of the Related Art

An organic light emitting display (OLED) device is an electronic device emitting light in response to a potential applied thereto. A structure of the OLED device includes an anode (positive electrode), an organic electroluminescence (EL) medium, and a cathode (negative electrode). In general, the organic EL medium disposed between the anode and the cathode includes a hole transportation layer (HTL) and an electron transportation layer (ETL). Holes and electrons are recombined in the ETL near the interface of HTL/ETL to emit light. Tang et al. describes a very effective OLED using a structure including the foregoing layers in the document ["Organic Electroluminescent Diodes", Applied Physics Letters, 51, 913 (1987)] and U.S. Pat. No. 4,769,292 which was generally assigned.

OLED devices have various structures. In a 1-stack soluble hybrid OLED device illustrated in FIG. 1, R, G, and B are realized by forming a hole injection layer (HIL), an HTL, and an emission layer (EML) through a soluble process (or a solution process) and an ETL/electron injection layer (EIL), and a cathode through thermal evaporation. This OLED device has a limitation in efficiency, power consumption and color coordinate adjustment due to 1 stack. Also, after the EIL is vacuum-deposited, when the EIL is exposed to normal pressure and subjected to a soluble process, in spite of an $N_2$ atmosphere, an element is damaged, which negatively affects efficiency and lifespan, and thus, it is impossible to form a 2-stack OLED device with this scheme. In particular, when the ETL and EIL, which are vulnerable to moisture, are exposed again to normal pressure after vacuum-deposition, element efficiency and lifespan characteristics may not be desirable in spite of the $N_2$ atmosphere.

A 2-stack white OLED device illustrated in FIG. 2 generally uses a scheme of implementing white through a stacked structure of blue stack/yellowish green stacks and subsequently transmitting the same to R, G, and B color filters. The 2-stack white OLED device is superior to the 1-stack OLED device in terms of power consumption and luminance, however, efficiency loss due to the use of color filters and color shift according to driving are problematic.

SUMMARY OF THE INVENTION

Embodiments of the present invention provide an organic light emitting display (OLED) device, as a hybrid OLED device of a soluble process and a deposition process, having enhanced efficiency and power consumption characteristics by forming 2-stack structure that includes a transition metal oxide layer.

In one aspect, there is an organic light emitting display (OLED) device comprising a substrate on which first to third light emitting portions are defined, first electrodes respectively positioned on the first to third light emitting portions, and a first stack formed on the first electrodes and including a first light emitting layer corresponding to the first light emitting portion, a second light emitting layer corresponding to the second light emitting portion, and a third light emitting layer corresponding to the third light emitting portion, an N-type charge generation layer (CGL) positioned on the first stack, a transition metal oxide layer positioned on the N-type CGL, a second stack positioned on the transition metal oxide layer and including a fourth light emitting layer corresponding to the first light emitting portion, a fifth light emitting layer corresponding to the second light emitting portion, and a sixth light emitting layer corresponding to the third light emitting portion, and a second electrode positioned on the second stack.

In another aspect, there is a method of manufacturing an organic light emitting display (OLED) device. The method comprises forming first electrodes on a substrate on which first to third light emitting portions are defined, respectively, forming a first stack on the first electrodes by forming a first light emitting layer to correspond to the first light emitting portion, a second light emitting layer to correspond to the second light emitting portion, and a third light emitting layer to correspond to the third light emitting portion, forming an N-type charge generation layer (CGL) on the first stack forming a transition metal oxide layer on the N-type CGL, forming a second stack on the transition metal oxide layer by forming a fourth light emitting layer to correspond to the first light emitting portion, a fifth light emitting layer to correspond to the second light emitting portion, and a sixth light emitting layer to correspond to the third light emitting portion, and forming a second electrode on the second stack.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Hereinafter, various embodiments of the present invention will be described in detail with reference to the accompanying drawings.

Figure 1:
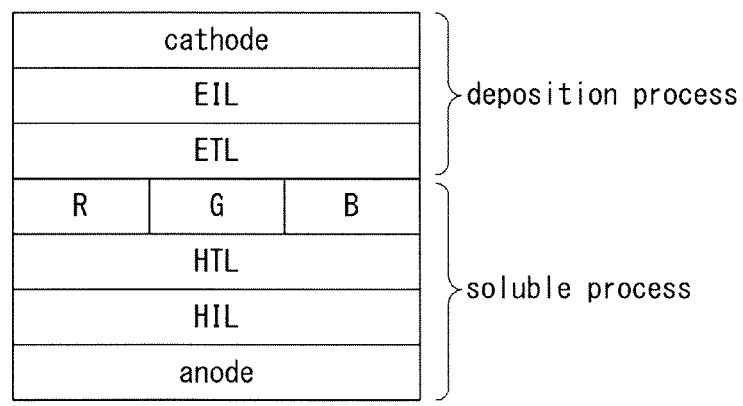
FIG. 1 is a view illustrating a 1-stack soluble hybrid organic light emitting display (OLED) device according to the related art.
Figure 2:
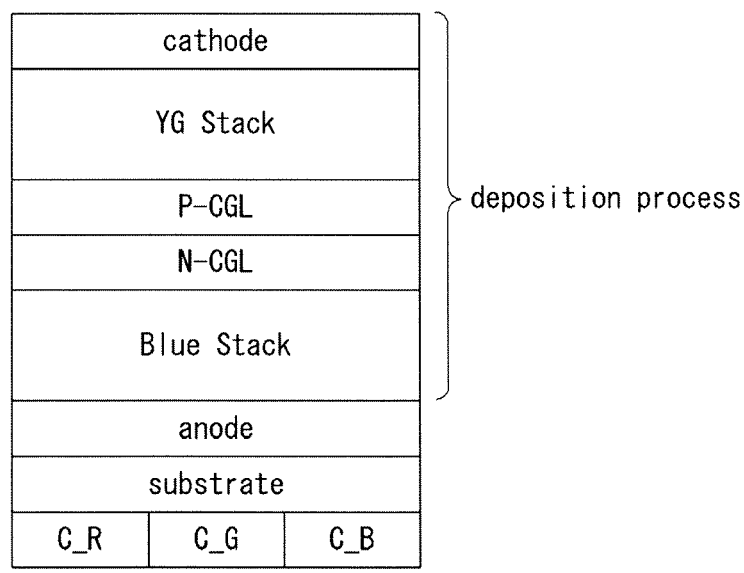
FIG. 2 is a view illustrating a 2-stack soluble hybrid OELD device according to the related art.
Figure 3:
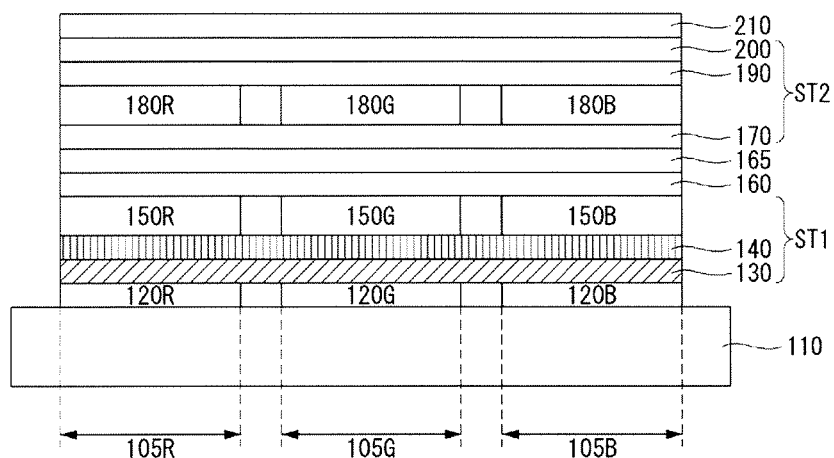
FIG. 3 is a view illustrating an OLED device according to an embodiment of the present invention.

FIG. 3 is a view illustrating an organic light emitting display (OLED) device according to an embodiment of the present invention.

Referring to FIG. 3, an OLED device 100 according to an embodiment of the present invention may be an organic electroluminescence (EL) device emitting light having red, green, and blue wavelengths. In an embodiment of the present invention, three subpixels form a single unit pixel, and each subpixel includes a red light emitting portion 105 emitting red light, a green emitting light unit 105G emitting green light, and a blue emitting light unit 105B emitting blue light, realizing full color.

The OLED device 100 according to an embodiment of the present invention includes stacks positioned between first electrodes 120R, 120G, and 120B and a second electrode 210. The stacks include a first stack ST1 including a first light emitting layer 150R, a second light emitting layer 150G and a third light emitting layer 150B, and a second stack ST2 positioned on the first stack ST1 that includes a fourth light emitting layer 180R, a fifth light emitting layer 180G and a sixth light emitting layer 180B.

In more detail, the substrate 110 may be formed of transparent glass, plastic or a conductive material allowing light to be transmitted therethrough. The first electrodes 120R, 120G, and 120B are positioned in the red light emitting portion 150R, the green light emitting portion 150G, and the blue light emitting portion 150B, respectively, on the substrate 110. The first electrodes 120R, 120G, and 120B are transparent anode electrodes having high work function and may be formed of any one selected from indium tin oxide (ITO), indium zinc oxide (IZO), and zinc oxide (ZnO). The first electrodes 120R, 120G, and 120B are patterned to be spaced apart from each other. Each pixel area can be demarcated by a bank layer. The second electrode 210 is a cathode electrode having low work function, formed of a metal such as aluminum (Al), magnesium (Mg), silver (Ag), or calcium (Ca), and as illustrated, the single second electrode 210 can be formed above the entirety of the red light emitting portion 105R, the green light emitting portion 105G, and the blue light emitting portion 105B.

The first stack ST1 forms a single light emitting element unit including a first light emitting layer 150R emitting red light, a second light emitting layer 150G emitting green light, and a third light emitting layer 150B emitting blue light. In more detail, the first light emitting layer 150R is positioned in the red light emitting portion 105R, the second light emitting layer 150G is positioned in the green light emitting portion 105G, and the third light emitting layer 150B is positioned in the blue light emitting portion 105B.

The first light emitting layer 150R emits red light and may be formed by adding one or more red phosphorescence dopants selected from among Ir(Mnpy)$_3$, Btp$_2$Ir(acac)(bis (2O-benzo[4,5-a]thienyl)pyridinato-N,C3O)iridium(zcety-lactonate) and Btp$_2$Ir(acac)(iridium(III)bis(1-phenylisoqui-nolyl)-N,C2')acetyl to any one host selected from among CBP(4,4'-bis(carbazol-9-yl)biphenyl), and Balq(Bis(2-methyl-8-quinlinolato-N1,O8)-(1,1'-Biphenyl-4-olato)alu-minium), for example. The second light emitting layer 150G emits green light and may be formed by adding a green phosphorescence dopant of Ir(ppy)$_3$ to any one host selected from among CBP(4,4'-bis(carbazol-9-yl)biphenyl), and Balq(Bis(2-methyl-8-quinlinolato-N1,O8)-(1,1'-Biphenyl-4-olato)aluminium), for example. The third light emitting layer 150B emits blue light and may be formed by adding blue phosphorescence dopants of 1,6-Bis(diphenylamine) pyrene and TBPe(tetrakis(t-butyl)perylene), a deep blue dopant of 4'-N,N-diphenylaminostyryl-triphenyl(DPA-TP), 2,5,2',5'-tetrastyryl-biphenyl (TSB), or an anthrancene-based derivative, or a sky blue dopant of p-bis-(p-N,N-diphenyl-aminostyryl)benzene or phenylcyclopentadiene to a host material of AND(9,10-di(2-naphthyl)anthracene) or DPVBi(4,4'-bis(2,2-diphenylethen-1-yl)-diphenyl).

The first stack ST1 further includes a hole injection layer 130 and a first hole transportation layer 140 formed between the first electrodes 120R, 120G and 120B and the first to third light emitting layers 150R, 150G and 150B. The hole injection layer 130 serve to allow holes to be aptly injected from the first electrodes 120R, 120G and 120B to the third light emitting layers 150R, 150G and 150B and may be formed of one or more selected from the group consisting of CuPc (cupper phthalocyanine), PEDOT (poly(3,4)-ethylene-dioxythiophene), PANI (polyaniline) and NPD (N,N'-bis (naphthalen-1-yl)-N,N'-bis(phenyl)-2,2'-dimethylbenzi-dine), but the present invention is not limited thereto. The first hole transportation layer 140 serves to allow holes to be aptly transported and may be formed of one or more selected from the group consisting of NPD(N,N'-bis(naphthalen-1-yl)-N,N'-bis(phenyl)-2,2'-dimethylbenzidine), TPD(N,N'-bis(3-methylphenyl)-N,N'-bis-(phenyl)-benzidine), spiro-TAD(2,2',7,7'-tetrakis(N,N-diphenylamino)-9,9'-spirofluorene) and MTDATA(4,4',4"-Tris(N-3-methylphenyl-N-phenylamino)-triphenylamine), but the present invention is not limited thereto.

An N-type charge generation layer (CGL) 160 is positioned on the first stack ST1. The N-type CGL 160 generates charges or injects charges to the light emitting layers formed in the first stack ST1 and the second stack ST2. That is, the N-type CGL 160 supplies electrons to the first to third light emitting layers 150R, 150G and 150B adjacent to the first electrodes 120R, 120G and 120B. Thus, luminous efficiency of the OLED device may be further increased and a driving voltage may be lowered.

The N-type CGL 160 may be formed of a metal or an organic material doped with an N type. Here, the metal may be one selected from the group consisting of Li, Na, K, Rb, Cs, Mg, Ca, Sr, Ba, La, Ce, Sm, Eu, Tb, Dy, and Yb. Also, as an N-type dopant used for an organic material doped with an N type and a host material, generally used materials may be used. For example, the N-type dopant may be an alkali metal, an alkali metal compound, an alkaline earth metal, or an alkaline earth metal compound. In more detail, the N-type dopant may be one selected from the group consisting of Cs, K, Rb, Mg, Na, Ca, Sr, Eu, and Yb. The host material may be one selected from the group consisting of tris(8-hydroxy-quinoline)aluminum, triazine, a hydroxyquinoline derivative, a benzazole derivative, and a silole derivative.

A transition metal oxide layer 165 is positioned on the N-type CGL 160. The transition metal oxide layer 165 serves as a passivation layer with respect to a P-type CGL to enhance efficiency and power consumption characteristics of the OLED device.

The transition metal oxide may be oxide of metal elements including scandium (Sc), titanium (Ti), vanadium (V), chromium (Cr), manganese (Mn), iron (Fe), cobalt (Co), nickel (Ni), copper (Cu), indium (In), tin (Sn), germanium (Ge), yttrium (Y), zirconium (Zr), niobium (Nb), molybdenum (Mo), tantalum (Ta), and tungsten (W). In these metal elements, one to nine electrodes fill d-orbitals, and since an energy gap of the 4s/3d orbital and the 5s/4d orbital is very narrow, electrons of the s/d orbital are involved in bonding to have various oxidation numbers. Also, metal/semiconductor/nonmetal qualities are determined by an electron structure between transition metal and oxygen ions, and energy level alignment with an organic material is facilitated due to a wide work function range of a transition metal oxide.

In general, a work function of tungsten ranges from 4.32 to 5.22 eV, a work function of molybdenum ranges from 4.36 to 4.95 eV, and a work function of vanadium is about 4.3 eV. These transition metals are formed in the form of a tungsten oxide (WOx), a molybdenum oxide (MoOx), and a vanadium oxide (VxOy), which may have a work function increased to be greater than those in the original transition metal state, depending on the oxidation number, thickness, and oxidation state of a central metal. Generally, when a work function of an organic metal ranges from 0.5 to 1.5 eV with respect to an HOMO level of a hole transportation layer, the organic material properly acts as a P-type CGL, and when a work function of an organic metal has a difference ranging from 0 to 1.0 eV with respect to an HOMO level of a hole injection layer or a hole transportation layer adjacent to a Fermi level of the inorganic material, the inorganic material properly acts as a P-type CGL.

A work function can be adjusted by performing a plasma treatment on a transition metal oxide layer 165 with $O_2$, $N_2$, or argon (Ar), or a mixture gas thereof, and leveling the same with a HOMO level with a hole injection layer manufactured through a solution process, thereby performing hole injection smoothly.

That is, in an embodiment of the present invention, the transition metal oxide layer 165 having a value ranging from about 5.0 to 5.9 eV serves as a P-type CGL such that it may be aligned in 5.5 to 5.9 eV of an HOMO level of a general hole transportation layer. Also, the transition metal oxide layer 165 is an inorganic material, and thus, it may remarkably serve as a passivation layer under a normal pressure atmosphere (under an inert gas atmosphere such as $N_2$, or the like).

The transition metal oxide layer 165 is plasma-treated with $O_2$, $N_2$, or argon (Ar), or a mixture gas thereof to adjust surface roughness, morphology, surface tension, hydrophilicity, and the like. In addition, a plasma treatment for hydrophilicity can utilize $O_2$, $N_2$, or argon (Ar), or a mixture gas thereof, and a plasma treatment for hydrophobicity can utilize a $CF_4$ gas. A grain size of amorphous crystal of the transition metal oxide layer 165 can range from 0.5 to 10 nm, facilitating film formation of a subsequent layer. Also, a thickness of the transition metal oxide layer 165 may range from 0.5 to 30 nm. Here, when the thickness of the transition metal oxide layer 165 is equal to or greater than 0.5 nm, the transition metal oxide layer 165 may serve as a P-type CGL and a passivation layer, and when the thickness of the transition metal oxide layer is equal to or smaller than 30 nm, since the thickness of the transition metal oxide layer 165 is so large, a driving voltage is prevented from increasing.

Thus, by adjusting surface roughness, morphology, surface tension, hydrophilicity by plasma-treating the transition metal oxide layer 165 with $O_2$, $N_2$, or argon (Ar), or a mixture gas thereof, the hole injection layer or the hole transportation layer may be smoothly formed on the transition metal oxide layer 165 through a soluble process such as spin coating or ink-jetting.

As described above, in the OLED device according to the present invention, the transition metal oxide layer 165 is formed as a P-type CGL and also serves as a passivation layer for a layer that is vulnerable to moisture, such as the electron transportation layer or the electron injection layer. Thus, the soluble process may be performed on the substrate with the electron transportation layer formed thereon at normal pressure ($N_2$ atmosphere). Thus, the 2-stack hybrid OLED device may be manufactured and device efficiency, power consumption, color coordinate characteristics may be enhanced.

In an embodiment of the present embodiment, the transition metal oxide layer 165 serving as a P-type CGL and a PN junction CGL of an N-type CGL 162 will be described as examples, but the present invention is not limited thereto and a structure of a PIN junction CGL in which an insulator layer such as Cupc, or the like, is further formed between the transition metal oxide layer 165 and the N-type CGL 162 may also be provided.

The second stack ST2 is positioned on the transition metal oxide layer 165. Like the first stack ST1, the second stack ST2 forms a single light emitting element unit including fourth light emitting layer 180R emitting red light, a fifth light emitting layer 180G emitting green light, and a sixth light emitting layer 180B emitting blue light. In detail, the fourth light emitting layer 180R is positioned in the red light emitting portion 105R such that it corresponds to the first light emitting layer 150R, the fifth light emitting layer 180G is positioned in the green light emitting portion 105G such that it corresponds to the second light emitting layer 150G, and the sixth light emitting layer 180B is positioned in the blue light emitting portion 105B such that it corresponds to the third light emitting layer 150B.

Like the first light emitting layer 150R, the fourth light emitting layer 180R emits red light and may be formed by adding one or more red phosphorescence dopants selected from among Ir(Mnpy)$_3$, Btp$_2$Ir(acac)(bis(2O-benzo[4,5-a]thienyl)pyridinato-N,C3O)iridium(zcetylactonate) and Btp$_2$Ir(acac)(iridium(III)bis(1-phenylisoquinolyl)-N,C2') acetyl to any one host selected from among CBP(4,4'-bis (carbazol-9-yl)biphenyl), and Balq(Bis(2-methyl-8-quinlinolato-N1,O8)-(1,1'-Biphenyl-4-olato)aluminium), for example. Like the second light emitting layer 150G, the fifth light emitting layer 180G emits green light and may be formed by adding a green phosphorescence dopant of Ir(ppy)$_3$ to any one host selected from among CBP(4,4'-bis (carbazol-9-yl)biphenyl), and Balq(Bis(2-methyl-8-quinlinolato-N1,O8)-(1,1'-Biphenyl-4-olato)aluminium), for example. Like the third light emitting layer 150B, the sixth light emitting layer 180B emits blue light and may be formed by adding blue phosphorescence dopants of 1,6-Bis (diphenylamine)pyrene and TBPe(tetrakis(t-butyl) perylene), a deep blue dopant of 4'-N,N-diphenylaminostyryl-triphenyl(DPA-TP), 2,5,2',5'-tetrastyryl-biphenyl (TSB), or an anthrancene-based derivative, or a sky blue dopant of p-bis-(p-N,N-diphenyl-aminostyryl)benzene or phenyl cyclopentadiene to a host material of AND(9,10-di (2-naphthyl)anthracene) or DPVBi(4,4'-bis(2,2-diphenylethen-1-yl)-diphenyl).

The second stack ST2 further includes a second hole transportation layer 170 formed between the transition metal oxide layer 165 and the fourth to sixth light emitting layers 180R, 180G, and 180B. Like the first hole transportation layer 140, the second hole transportation layer 170 serves to allow holes to be aptly transported and may be formed of one or more selected from the group consisting of NPD(N, N'-bis(naphthalen-1-yl)-N,N'-bis(phenyl)-2,2'-dimethylbenzidine), TPD(N,N'-bis(3-methylphenyl)-N,N'-bis-(phenyl)-benzidine), spiro-TAD(2,2',7,7'-tetrakis(N,N-diphenylamino)-9,9'-spirofluorene) and MTDATA(4,4',4'''-Tris(N-3-methylphenyl-N-phenylamino)-triphenylamine), but the present invention is not limited thereto.

The second stack ST2 further includes an electron transportation layer 190 and an electron injection layer 200 formed on the fourth to sixth light emitting layers 180R, 180G, and 180B. The electron transportation layer 190 serves to allow electrons to be aptly transported, and may be formed of one or more selected from the group consisting of $Alq_3$(tris(8-hydroxyquinolino)aluminum), PBD, TAZ, spiro-PBD, BAlq, and SAlq, but the present invention is not limited thereto. The electron injection layer 200 serves to allow electrons to be aptly injected, and may be formed of one or more selected from the group consisting of, Li, Ba, and $BaF_2$, but the present invention not limited thereto.

In the first stack ST1, an electron transportation layer or a hole blocking layer may be further provided between the first to third light emitting layers 150R, 150G, and 150B and the N-type CGL 160, but the present invention is not limited thereto.

As described above, in the OLED device according to an embodiment of the present invention, since the transition metal oxide layer serves as both a P-type CGL and a passivation layer, a soluble process may be performed on the substrate with the electron transportation layer formed thereon at normal pressure ($N_2$ atmosphere). Thus, the 2-stack hybrid OLED device may be manufactured and device efficiency, power consumption, color coordinate characteristics may be enhanced.

FIGS. 4A through 4E are views illustrating sequential processes of a method of manufacturing an OLED device according to an embodiment of the present invention.

Figure 4A:
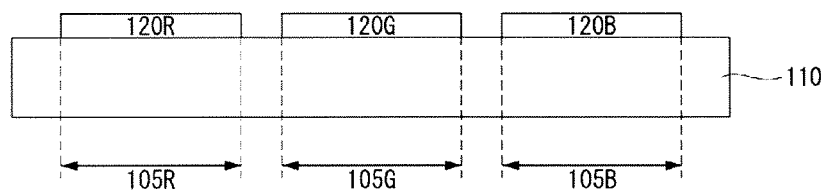
FIGS. 4A through 4E are views illustrating sequential processes of a method of manufacturing an OLED device according to an embodiment of the present invention.
Figure 4B:
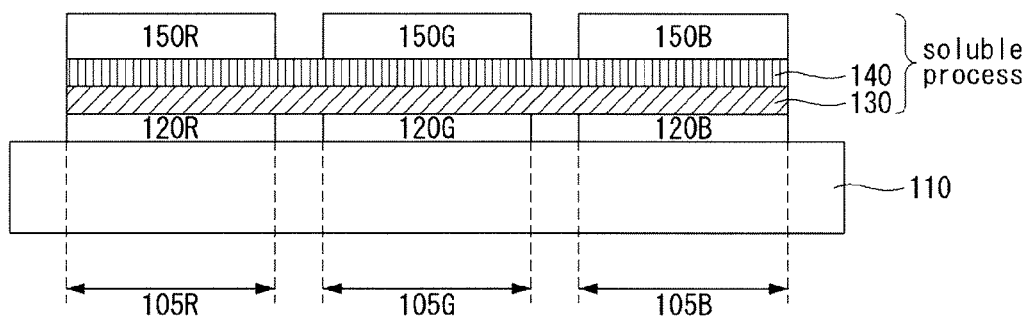

Referring to FIG. 4A, any one of indium tin oxide (ITO), indium zinc oxide (IZO), and zinc oxide (ZnO) is deposited on the substrate 110 using a deposition method such as sputtering, or the like. Subsequently, the deposited material is patterned through photolithography to form a first electrode 120R in a red light emitting portion 105R, a first electrode 120G in a green light emitting portion 105G, and a first electrode 120B in a blue light emitting portion 150B. Although not shown, the first electrodes are demarcated by a bank layer.

Subsequently, referring to FIG. 4, a hole injection layer 130 is formed on the substrate 110 with the first electrodes 120R, 120G, and 120B formed thereon. The hole injection layer 130 may be formed with the foregoing hole injection material through a soluble process such as ink-jetting, nozzle coating, spray coating, or roll printing. Thereafter, a hole transportation layer 140 is formed on the hole injection layer 130. The hole transportation layer 140 is formed of the foregoing hole transportation material and formed through the soluble process, like the hole injection layer 130.

Thereafter, a first light emitting layer 150R emitting red light is formed in the red light emitting portion 105R, a second light emitting layer 150G emitting green light is formed in the green light emitting portion 105G, and a third light emitting layer 150B emitting blue light is formed in the blue light emitting portion 105B, on the substrate 110 with the hole transportation layer 140 formed thereon through the soluble process such as ink-jetting, nozzle coating, spray coating, or roll printing.

Figure 4C:
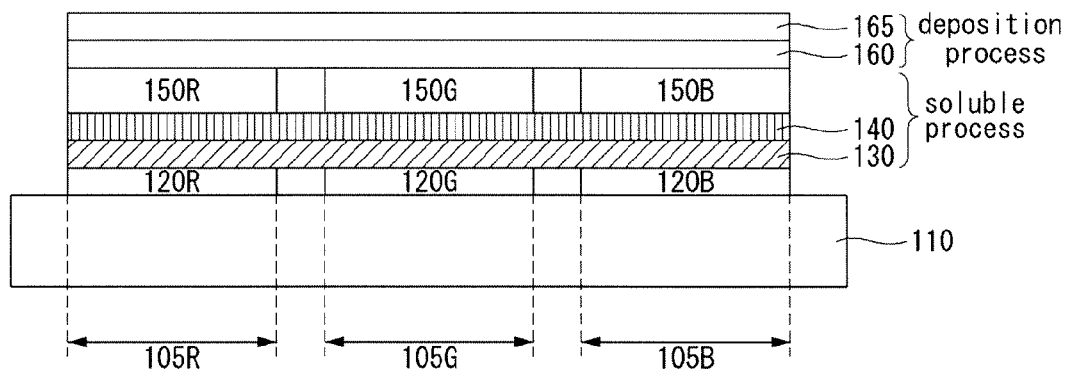

Thereafter, referring to FIG. 4C, the substrate 110 having the first to third light emitting layers 150R, 150G, and 150B is transferred to a vacuum chamber, in which an N-type CGL and a transition metal oxide layer are formed.

Figure 4D:
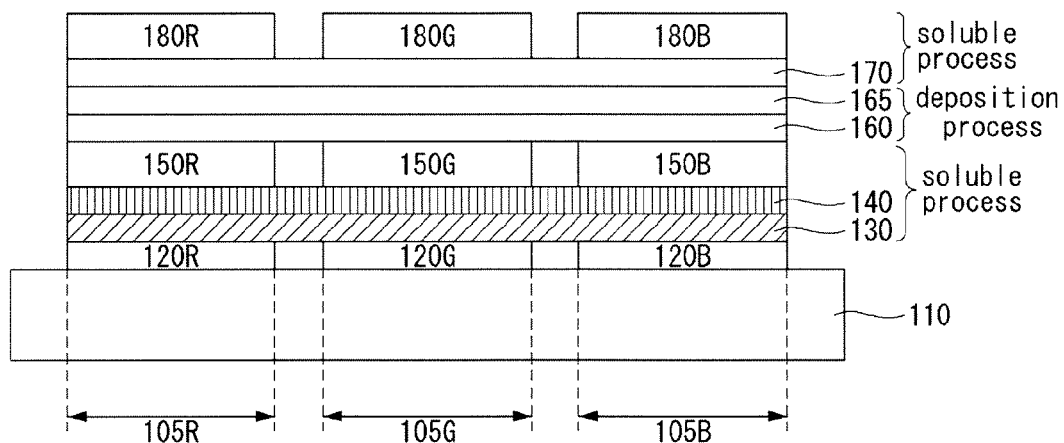

Thereafter, referring to FIG. 4D, the substrate 110 with the transition metal oxide layer 165 formed thereon is removed from the vacuum chamber, and a hole transportation layer 170 is formed thereon at normal pressure through a soluble process. Thereafter, a fourth light emitting layer 180R emitting red light is formed in the red light emitting portion 105R, a fifth light emitting layer 180G emitting green light is formed in the green light emitting portion 105G, and a sixth light emitting layer 180B emitting blue light is formed in the blue light emitting portion 105B on the hole transportation layer through a soluble process such as ink-jetting, nozzle coating, spray coating, or roll printing.

Figure 4E:
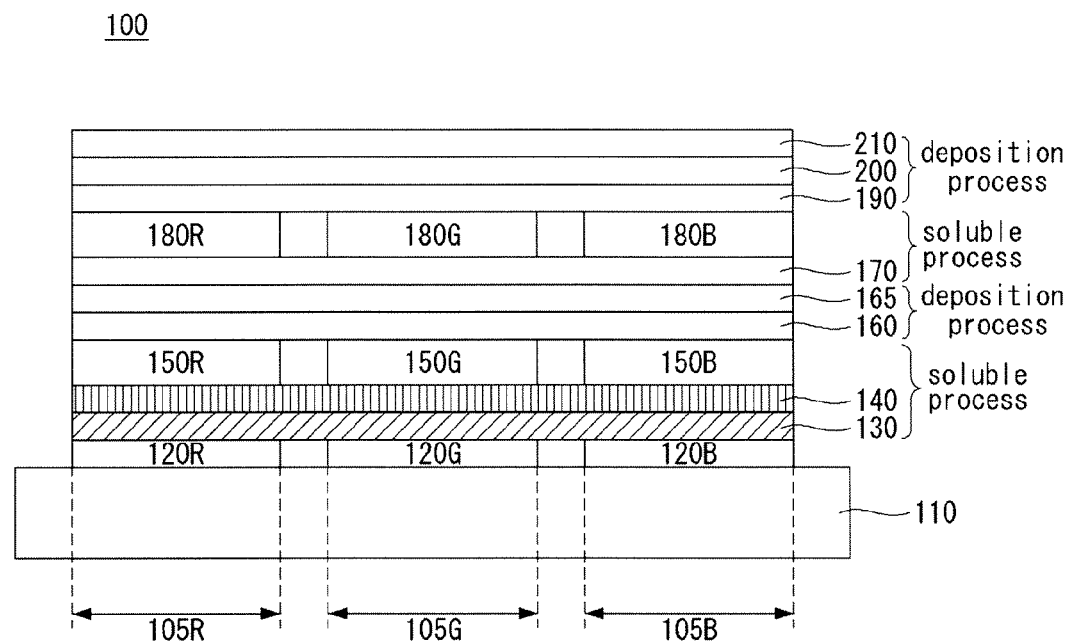

Thereafter, referring to FIG. 4E, the substrate 110 with the fourth to sixth light emitting layers 180R, 180G, and 180B formed thereon are transferred to the vacuum chamber, and an electron transportation layer 190, an electron injection layer 200, and a second electrode 210 are sequentially formed therein through a vacuum deposition method.

In this manner, in an embodiment of the present invention, the hole injection layer 30, the hole transportation layers 140 and 170, and the first to sixth light emitting layers 150R, 150G, 150B, 180R, 180G, and 180B are formed through a soluble process, and the N-type CGL 160, the transition metal oxide layer 165, the electron transportation layer 190, the electron injection layer 200, and the second electrode 210 are formed through the vacuum deposition layer. Accordingly, in an embodiment of the present invention, red, green, and blue color coordinates and efficiency may be enhanced, while reducing cost.

Hereinafter, an embodiment of the present invention will be described to help understanding of the present invention. However, the embodiment is merely illustrative and the present invention is not limited thereto.

COMPARATIVE EXAMPLE

ITO glass having sheet resistance equal to 30Ω, a thickness equal to 1.08 mm, and light transmittance equal to or greater than 80% was subsequently cut to a size of 2 cm×2 cm, and a portion of the ITO layer was removed using an etching solution. Also, the ITO glass was cleaned with an ultrasonic cleaner for 15 minutes each time in the order of Acetone/Methanol/IPA, cleaned with ionic water, and subsequently dried under a 230° C. temperature condition for 30 minutes through annealing. Thereafter, HAT-CN having a thickness equal to 50 Å was deposited as a hole injection layer, NPD(N,N'-bis(naphthalen-1-yl)-N,N'-bis(phenyl)-2, 2'-dimethylbenzidine) having a thickness equal to 1200 Å was deposited and formed as a hole transportation layer, and thereafter, red, green, and blue light emitting layers were deposited thereon in each of light emitting portions using a shadow mask, to form a first stack. Thereafter, a Bphen compound having a thickness equal to 100 Å was deposited as an N-type CGL, and a heteroaryl-based material having a thickness equal to 280 Å was deposited as a P-type CGL. Subsequently, an aryl amine-based material having a thickness equal to 200 Å was formed as a hole transportation layer, and red, green, and blue light emitting layers were deposited to correspond to the foregoing red, green, and blue light emitting layers. A heteroaryl-based material having a thickness equal to 200 Å was deposited as an electron transportation layer thereon, and LiF having a thickness equal to 10 Å was deposited as an electron injection layer to form a second stack. Thereafter, aluminum (Al) having a thickness equal to 2000 Å was deposited as a cathode, thus manufacturing an OLED device.

EMBODIMENT

ITO glass having sheet resistance equal to 30Ω, a thickness equal to 1.08 mm, and light transmittance equal to or greater than 80% was subsequently cut to a size of 2 cm×2 cm, and a portion of the ITO layer was removed using an etching solution. Also, the ITO glass was cleaned with an ultrasonic cleaner for 15 minutes each time in the order of Acetone/Methanol/IPA, cleaned with ionic water, and subsequently dried under a 230° C. temperature condition for 30 minutes through annealing. A hole injection layer and a hole transportation layer were coated to be formed, and red, green, and blue light emitting layers were coated to be formed in each of light emitting portions. In this example, each of the hole injection layer, the hole transportation layer, and the light emitting layers were formed using a soluble process. Thereafter, the substrate was transferred to a vacuum chamber, an N-type CGL layer was deposited and $WO_3$ was subsequently deposited to form a transition metal oxide layer. Here, the N-type CGL and the transition metal oxide layer were formed using a deposition process. Thereafter, the substrate was removed from the vacuum chamber, a hole transportation layer was coated on the substrate and red, green, and blue light emitting layers were formed in the light emitting portions, respectively. The substrate was transferred again to the vacuum chamber, an electron transportation layer, an electron injection layer, and a cathode were sequentially deposited to manufacture an OLED device.

Figure 5:
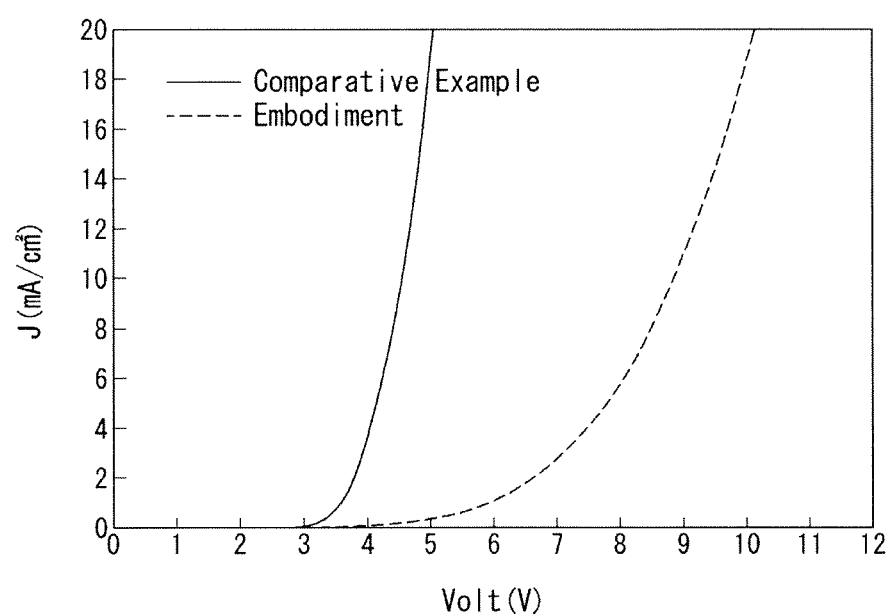
FIG. 5 illustrates voltage-current density graphs of OLED devices manufactured according to a Comparative Example and an Embodiment Example of the present invention.
Figure 6:
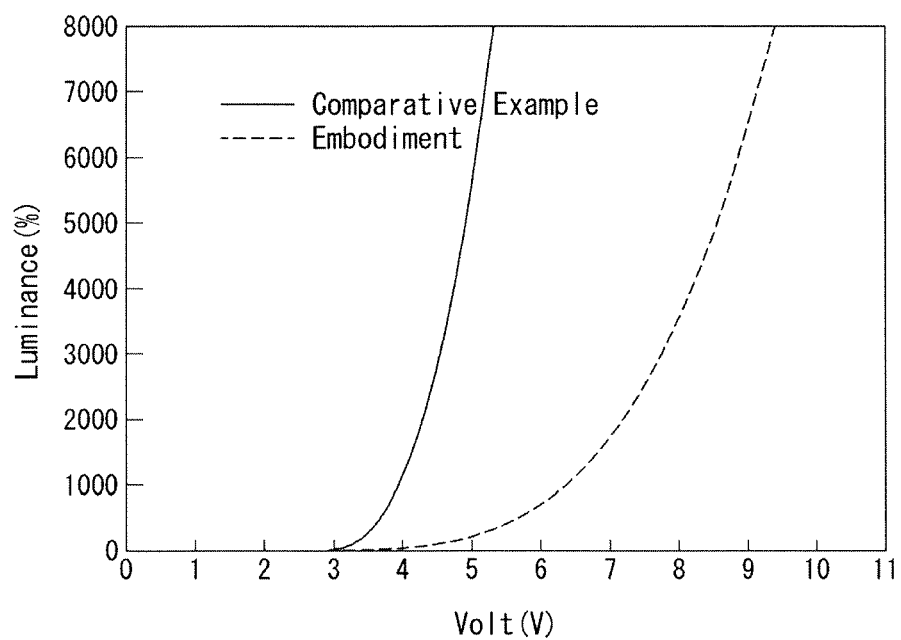
FIG. 6 illustrates voltage-luminance graphs of the OLED devices manufactured according to the Comparative Example and the Embodiment Example of the present invention.
Figure 7:
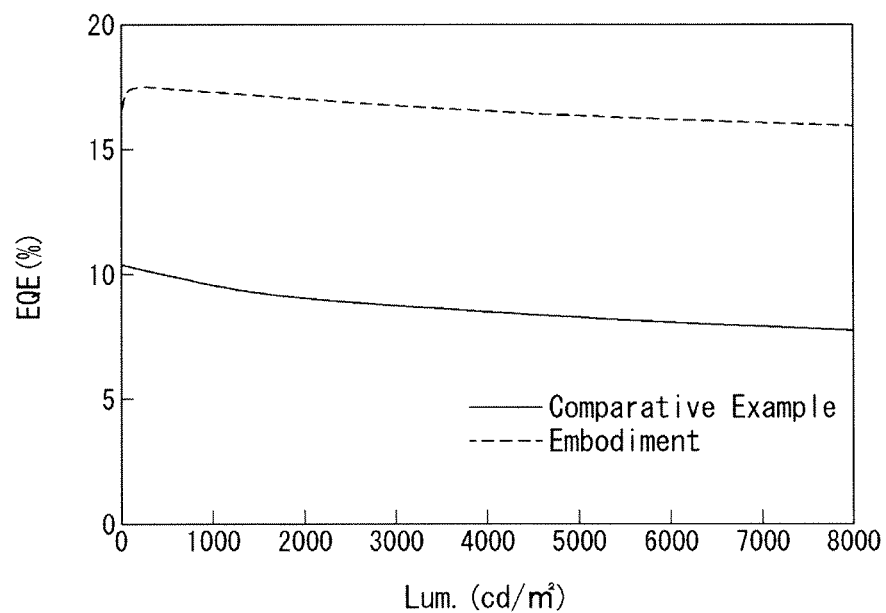
FIG. 7 illustrates luminance-quantum efficiency graphs of the OLED devices manufactured according to the Comparative Example and the Embodiment Example of the present invention.
Figure 8:
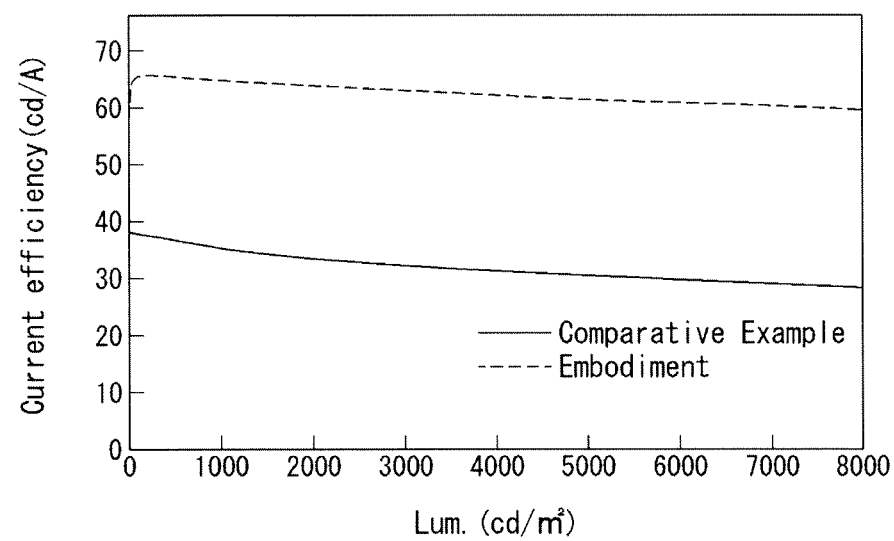
FIG. 8 illustrates luminance-current efficiency graphs of the OLED devices manufactured according to the Comparative Example and the Embodiment Example of the present invention.

Voltage-current density (V-J), voltage-luminance (V-L), luminance-quantum efficiency, and luminance-current efficiency of the OLED devices manufactured according to the Comparative Example and the Embodiment were measured. FIG. 5 illustrates voltage-current density graphs of OLED devices, FIG. 6 illustrates voltage-luminance graphs of the OLED devices, FIG. 7 illustrates luminance-quantum efficiency graphs of the OLED devices, and FIG. 8 illustrates luminance-current efficiency graphs of the OLED devices.

Also, driving voltages, quantum efficiency, luminous efficiency, and color coordinates of OLED devices manufactured according to the Comparative Example and the Embodiment were measured and the results are illustrated in Table 1.

TABLE 1

|  | Driving voltage (V) | Quantum efficiency (%) | Luminous efficiency (%) | Color coordinates | |
|---|---|---|---|---|---|
|  |  |  |  | CIE_x | CIE_y |
| Comparative Example | 3.9 | 9.6 | 34.9 | 0.314 | 0.632 |
| Embodiment | 5.3 | 17.3 | 63.9 | 0.322 | 0.626 |

Referring to FIGS. 5 through 8 and Table 1, compared with the Comparative Example, in the OLED device of the Embodiment, a driving voltage is increased slightly, a similar level of color coordinates were obtained, and quantum efficiency and luminous efficiency were increased by about double.

As described above, in the OLED device according to an embodiment of the present invention, since the transition metal oxide layer serving as a P-type CGL and passivation is formed, the soluble process may be performed on the substrate with the electron transportation layer formed thereon at normal pressure ($N_2$ atmosphere). Thus, the 2-stack hybrid OLED device may be manufactured and device efficiency, power consumption, color coordinate characteristics may be enhanced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display (OLED) device comprising:
   a substrate on which first to third light emitting portions are defined;
   first electrodes respectively positioned on the first to third light emitting portions;
   a first stack formed on the first electrodes and including a first light emitting layer corresponding to the first light emitting portion, a second light emitting layer corresponding to the second light emitting portion, and a third light emitting layer corresponding to the third light emitting portion;
   an N-type charge generation layer (CGL) positioned on the first stack;
   a transition metal oxide layer positioned on the N-type CGL;
   a second stack positioned on the transition metal oxide layer and including a fourth light emitting layer corresponding to the first light emitting portion, a fifth light emitting layer corresponding to the second light emitting portion, and a sixth light emitting layer corresponding to the third light emitting portion; and
   a second electrode positioned on the second stack.

2. The OLED device of claim 1, wherein the transition metal oxide layer is an oxide of any one selected from among scandium (Sc), titanium (Ti), vanadium (V), chromium (Cr), manganese (Mn), iron (Fe), cobalt (Co), nickel (Ni), copper (Cu), indium (In), tin (Sn), germanium (Ge), yttrium (Y), zirconium (Zr), niobium (Nb), molybdenum (Mo), tantalum (Ta), and tungsten (W).

3. The OLED device of claim 1, wherein the transition metal oxide layer has an highest occupied molecular orbital (HOMO) level ranging from 5.0 to 5.9 eV.

4. The OLED device of claim 1, wherein a thickness of the transition metal oxide layer ranges from 0.5 to 30 nm.

5. The OLED device of claim 1, wherein a grain size of amorphous crystal of the transition metal oxide layer ranges from 0.5 to 10 nm.

6. The OLED device of claim 1, wherein the first stack includes at least one among a hole injection layer and a hole transportation layer between the first electrodes and the first to third light emitting layers.

7. The OLED device of claim 1, wherein the second stack includes a hole transportation layer between the transition metal oxide layer and the fourth to sixth light emitting layers, and includes at least one among an electron transportation layer and an electron injection layer between the fourth to sixth light emitting layers and the second electrode.

8. The OELD device of claim 1, further comprising an insulating layer between the N-type CGL and the transition metal oxide layer.

9. The OELD device of claim 1, wherein the first stack includes an electron transportation layer or a hole blocking layer disposed between the first to third light emitting layers and the N-type CGL.

10. An organic light emitting display (OLED) device comprising:
a first stack including first, second and third light emitting layers corresponding to first, second and third light emitting portions, respectively;
a second stack including fourth, fifth and sixth light emitting layers corresponding to the first, second and third light emitting portions, respectively;
an N-type charge generation layer (CGL) disposed between the first and second stacks; and
a transition metal oxide layer disposed between the first and second stacks.

11. The OLED device of claim 10, wherein the transition metal oxide layer is configured as a P-type charge generation layer and a passivation layer configured to prevent moisture from a soluble process permeating to the first stack.

12. The OLED device of claim 10, further comprising:
a substrate positioned under the first and second stacks;
first, second and third anode electrodes disposed between the first stack and the substrate, and corresponding to the first, second and third light emitting portions, respectively; and
a cathode electrode positioned on the second stack as a common layer extending entirely across the first, second and third light emitting portions.

13. The OLED device of claim 10, wherein the first light emitting portion is configured to emit red light, the second light emitting portion is configured to emit green light, and the third light emitting portion is configured to emit blue light.

14. The OLED device of claim 10, wherein the first stack includes an electron transportation layer or a hole blocking layer disposed between the first to third light emitting layers and the N-type CGL.

* * * * *